United States Patent [19]
Usui et al.

[11] Patent Number: 5,591,268
[45] Date of Patent: Jan. 7, 1997

[54] PLASMA PROCESS WITH RADICALS

[75] Inventors: Kaoru Usui, Kawasaki; Shou Chiba, Aizuwakamatsu, both of Japan

[73] Assignee: Fujitsu Limited, Kawasaki, Japan

[21] Appl. No.: 505,151

[22] Filed: Jul. 21, 1995

[30] Foreign Application Priority Data

Oct. 14, 1994 [JP] Japan .................................. 6-249333
Feb. 27, 1995 [JP] Japan .................................. 7-038689

[51] Int. Cl.$^6$ .................................................. C23C 16/00
[52] U.S. Cl. .................. 118/723 E; 118/719; 118/723 I
[58] Field of Search ............................. 118/723 I, 723 E, 118/723 MP, 719; 156/345, 643.1; 216/68, 71; 204/298.39, 298.35, 298.34, 298.33, 298.07, 298.06, 298.25

[56] References Cited

U.S. PATENT DOCUMENTS

| | | | |
|---|---|---|---|
| 4,633,809 | 1/1987 | Hirose et al. | 118/719 |
| 4,676,195 | 6/1987 | Yasui et al. | 118/723 |
| 5,006,192 | 4/1991 | Deguchi | 156/345 |
| 5,217,560 | 6/1993 | Kurono et al. | 156/345 |
| 5,248,371 | 9/1993 | Maher et al. | 156/345 |
| 5,292,396 | 3/1994 | Takashima et al. | 156/345 |
| 5,405,447 | 4/1995 | Murata et al. | 118/723 E |
| 5,423,915 | 6/1995 | Murata et al. | 118/723 E |
| 5,496,594 | 3/1996 | Konig et al. | 427/569 |
| 5,498,290 | 3/1996 | Matossian et al. | 118/723 E |

*Primary Examiner*—Nam Nguyen
*Assistant Examiner*—Joni Y. Chang
*Attorney, Agent, or Firm*—Nikaido, Marmelstein, Murray & Oram LLP

[57] ABSTRACT

An apparatus for manufacturing a semiconductor device having: a process chamber capable of being evacuated; a coil unit for generating an alternating magnetic field in the process chamber; a conductive partition unit disposed in the process chamber for defining an inner space and generating another alternating magnetic field which cancels a change in the alternating magnetic field generated in the inner space, the partition unit allowing gas to be transported between the inner space and a space outside of the inner space; a pipe for supplying process gas to the process chamber; and a pipe for exhausting gas from said process chamber. The gas supply pipe and gas exhaust pipe have a plurality of openings directed to the inner space. Radicals are efficiently generated by inductively coupled plasma, and efficiently transported by a gas flow into time inner space.

24 Claims, 11 Drawing Sheets

PLASMA PROCESS WITH RADICALS

BACKGROUND OF THE INVENTION a) Field of the Invention

The present invention relates to a semiconductor manufacturing apparatus and method, and more particularly to a semiconductor manufacturing apparatus and method for generating plasma and processing the surface of semiconductor substrate.

b) Description of the Related Art

Various processes using plasma are widely applied to manufacture of semiconductor devices. However, if wafers are directly exposed to plasma, they are damaged.

An example of a conventional barrel type plasma processing system will be described with reference to FIGS. 10A and 10B.

FIG. 10A is a schematic perspective view of a barrel type plasma processing system. Two electrodes 101a and 101b are disposed on the wall of a cylindrical process chamber 100, the two electrodes facing each other through the process chamber. The electrode 101a is grounded and the electrode 101b is connected to a radio frequency (RF) power source 102.

As an RF voltage is applied between the electrodes 101a and 101b, an RF electric field is generated in the process chamber 100 into which process gas has been introduced. The RF electric field causes the process gas to discharge in a plasma state.

Wafers 103 are exposed to and processed by the plasma. Since the wafers 103 are directly exposed to the plasma, the wafer surfaces are adversely affected by the plasma, which is one of the reasons of lowering manufacture yield.

FIG. 10B is an equivalent circuit diagram of the plasma processing system shown in FIG. 10A. The electrodes 101a and 101b of the barrel type plasma processing system of FIG. 10A form a capacitor 121. An RF power is supplied from an RF power source 122 to the capacitor 121 formed by these electrodes so that capacitively coupled plasma is generated.

The structure and operation of one of conventional coaxial type plasma processing systems will be described with reference to FIGS. 11A and 11B.

FIG. 11A is a schematic perspective view of a conventional coaxial type plasma processing system. An external electrode 111 is disposed surrounding the wall of a cylindrical process chamber 110. A cylindrical internal electrode 112 is coaxially disposed in the process chamber 110. Through holes (not shown) are formed in the wall of the internal electrode 112, to allow gas to be transported between outer and inner spaces of the internal electrode 112 via the through holes. The internal electrode 112 is grounded and the outer electrode 111 is connected to an Rf power source 113.

In a cylindrical space defined between the internal and external electrodes 112 and 111, a gas supply pipe 114 and a gas exhaust pipe 115 are disposed at opposing positions relative to the center axis of the process chamber 110. A plurality of through holes (not shown) are formed in the walls of the gas supply and exhaust pipes 114 and 115 on the side opposite to the internal electrode 112 along the axial direction of the pipes 114 and 115. Process gas is introduced from the gas supply pipe 14 to the inside of the process chamber 110 via the through holes of the wall. The process gas is drawn from the through holes of the gas exhaust pipe 115 and exhausted to the outside of the process chamber 110.

FIG. 11B is a schematic cross sectional view of the plasma processing system shown in FIG. 11A as cut in a plane vertical to the center axis. The internal electrode 112 disturbs a flow of process gas. Therefore, most process gas flows in the circumferential directions indicated by arrows A in a cylindrical space between the inner electrode 112 and process chamber 110, and reaches the gas exhaust pipe 115. As an Rf voltage is applied across the inner and outer electrodes 111 and 112, capacitively coupled plasma is generated in this cylindrical space.

Wafers 116 are disposed in the inner space of the inner electrode 112. Although ions of the plasma generated outside of the inner electrode 112 do not enter the inner space of the inner electrode 112, part of radicals 117 diffuses from the through holes of the inner electrode 112 into the inner space where the wafers 116 are disposed. Diffused radicals react with the surfaces of the wafers 116. Reaction by-products diffuse outside of the inner electrode 112, move along the flow of the process gas, and are exhausted to the outside of the process chamber.

With the coaxial type plasma processing system shown in FIGS. 11A and 11B, an Rf electric field is not applied to the inner space of the inner electrode 112, and plasma is not generated in this inner space. Since the wafers 116 are not directly exposed to the plasma, it is possible to prevent damages by the plasma.

The coaxial type plasma processing system shown in FIGS. 11A and 11B is effective in that wafers are not directly exposed to plasma and are not susceptible to damages. However, a process is performed without using plasma energy so that the process speed lowers as compared to a barrel type plasma processing system. According to the experiments made by the inventors, a process speed by a coaxial type plasma processing system lowered to about a half of a process speed by a barrel type plasma processing system.

With the plasma processing system shown in FIGS. 11A and 11B, radicals reach the surface of a wafer mainly by only diffusion. Therefore, if a space between wafers is narrowed, radicals become difficult to reach the wafer surface so that a process speed is lowered. For example, with a gap between wafers being set to 9.52 mm, a plasma ashing rate was 90 nm/min, whereas with a gap between wafers being set to 4.76 mm, it lowered to 30 nm/min. A plasma etching rate also lowers if a gap between wafers is narrowed.

SUMMARY OF THE INVENTION

It is an object of the present invention to provide a semiconductor device manufacturing technique capable of performing a plasma process without lowering a process speed and while ensuring low susceptibility to damages.

It is another object of the present invention to provide a semiconductor device manufacturing technique capable of suppressing lowering of a plasma process speed even if a gap between wafers is narrowed.

According to one aspect of the present invention, there is provided an apparatus for manufacturing a semiconductor device including: a process chamber capable of being evacuated; means for generating an alternating magnetic field in the process chamber; partition means disposed in the process chamber for defining an inner space and generating another alternating magnetic field, said another alternating magnetic field cancelling a change in the alternating magnetic field generated in the inner space, and the partition means allowing gas to be transported between the inner space and a space outside of the inner space; means for supplying process gas to the process chamber; and means for exhausting gas from the process chamber.

As an alternating magnetic field is generated in the process chamber, an electric field linking with the alternating magnetic field is generated. Process gas introduced into the process chamber is discharged into a plasma state by this electric field. If another alternating magnetic field cancelling a change of the first generated magnetic field is generated in a partial space of the process chamber, plasma is not generated in this partial space.

If gas is allowed to be transported between a space where plasma is generated and a space where plasma is not generated, radicals in the plasma are supplied to the space where plasma is not generated. Radicals react with the surfaces of semiconductor wafers placed in this space. Since wafers are not directly exposed to the plasma, damages by the plasma can be avoided.

The means or generating an alternating magnetic field may comprise a coil wound on an outer surface of the process chamber and a radio frequency power source for supplying radio frequency current to the coil.

As radio frequency current is flowed in the coil wound on the outer circumference of the process chamber, an alternating magnetic field is generated in the process chamber. If a cylindrical member made of an electrically conductive body is placed in the process chamber in parallel to the magnetic field in the axial direction, a change in the magnetic field generates induction current flowing in the cylindrical member in the circumferential direction. This induction current generates another alternating magnetic field in the inner space of the cylindrical member which magnetic field cancels a change in the first generated magnetic field.

The partition means may comprise an electrically conductive body of a cylindrical shape, a plurality of through holes being formed in a wall of the conductive body.

The through holes formed in the wall of the cylindrical member allow gas to be transported between the inner space and the outer space of the cylindrical member.

According to another aspect of the present invention, there is provided an apparatus for manufacturing a semiconductor device having: a process chamber having an inner space; partition means for partitioning the inner space into a plasma generating space and a process space where a workpiece is disposed for a plasma process, the partition means being formed with gas flow holes allowing gas to be transported between the plasma generating space and the process space; means disposed in the inner space for supplying process gas to the process space; and means for exhausting the process gas from the inner space.

Radicals in the plasma generated in the plasma generating space diffuse into the process space via the gas flow holes formed in the wall of the partition means. Since process gas is directed into the process space from the gas supply means, a gas flow is established in the process space. Radicals diffused into the process space are pulled in and transported by this gas flow to the surfaces of wafers.

Since radicals are forcibly transported to the surfaces of wafers, it is possible to react radicals with the surfaces of wafers. Since reaction by-products are also exhausted to the outside by the gas flow, new radicals are always supplied to the wafer surface.

The gas supply means may be disposed in the process space near at the peripheral area thereof.

The gas exhaust means may be disposed facing the gas supply means with a central area of the process space being interposed therebetween.

If time gas exhaust means is disposed facing the gas supply means with the central area of the process space being interposed therebetween, generally a uniform gas flow is formed in the process space. With the uniform gas flow, it is possible for wafers disposed in the process space to be subjected to generally a uniform plasma (radical) process.

The partition means may be of a cylindrical shape and define time process space inside of the partition means and the plasma generating space outside of the partition means, and the gas supply means may be a straight tube disposed generally in parallel to the partition means in an axial direction, a wall of the straight tube facing a central area of the process space being formed with a plurality of gas jet holes along the axial direction.

If the partition means of a cylindrical shape is used for defining the cylindrical process space, a number of wafers can be ranked in the longitudinal direction of the cylindrical partition means and processed at the same time. By disposing the gas supply means of a straight tube generally in parallel to the partition means in an axial direction, process gas can be generally uniformly introduced into the cylindrical process space. By forming gas jet holes in the wall of the straight tube facing the central area of the process space, process gas can be introduced into the process space.

The gas exhaust means may be a straight tube disposed generally in parallel to the partition means in an axial direction, a wall of the straight tube facing a central area of the process space being formed with a plurality of gas intake holes along the axial direction.

By using the gas exhaust means of a straight tube like the gas supply means of a straight tube, a flow of process gas in the process space can be formed more uniformly.

The partition means may be made of electrically conductive material, and the apparatus may further comprises an external electrode mounted on an outer surface of the process chamber surrounding the plasma generating space, and a radio frequency power source for supplying a radio frequency voltage across the partition means and the outer electrode.

The partition means may be made of electrically conductive material, and the apparatus may further comprises a radio frequency coil wound on an outer surface of the process chamber surrounding the inner space of the process chamber, and a radio frequency power source for supplying radio frequency current to the radio frequency coil.

The partition means made of electrically conductive material can be used as an electrode. By disposing an external electrode on the outer circumference of the process chamber and applying a radio frequency voltage between the external electrode and partition means, it becomes possible to generate a radio frequency electric field in the plasma generating space. This radio frequency electric field generates capacitively coupled plasma in the plasma generating space.

As radio frequency current is flowed in the radio frequency coil wound on the outer circumference of the process chamber, inductively coupled plasma can be generated in the plasma generating space. If the partition means made of electrically conductive material is used, it is possible to prevent the generation of plasma in the process space.

As above, damages of wafer surfaces can be suppressed without lowering a process speed. It is therefore possible to improve manufacture yield without lowering throughput.

Since radicals in plasma can be forcibly transported to the surfaces of wafers, a relatively high plasma process speed can be obtained even if a plurality of wafers are disposed at a narrow pitch in the plasma processing system. Since wafers can be disposed at a narrow pitch, it is possible to increase the number of wafers which can be processed at the same time, and thereby improve productivity.

DETAILED DESCRIPTION Of THE PREFERRED EMBODIMENTS

A plasma processing system according to an embodiment of the invention will be described with reference to FIGS. 1 to 4B.

Figure 1:
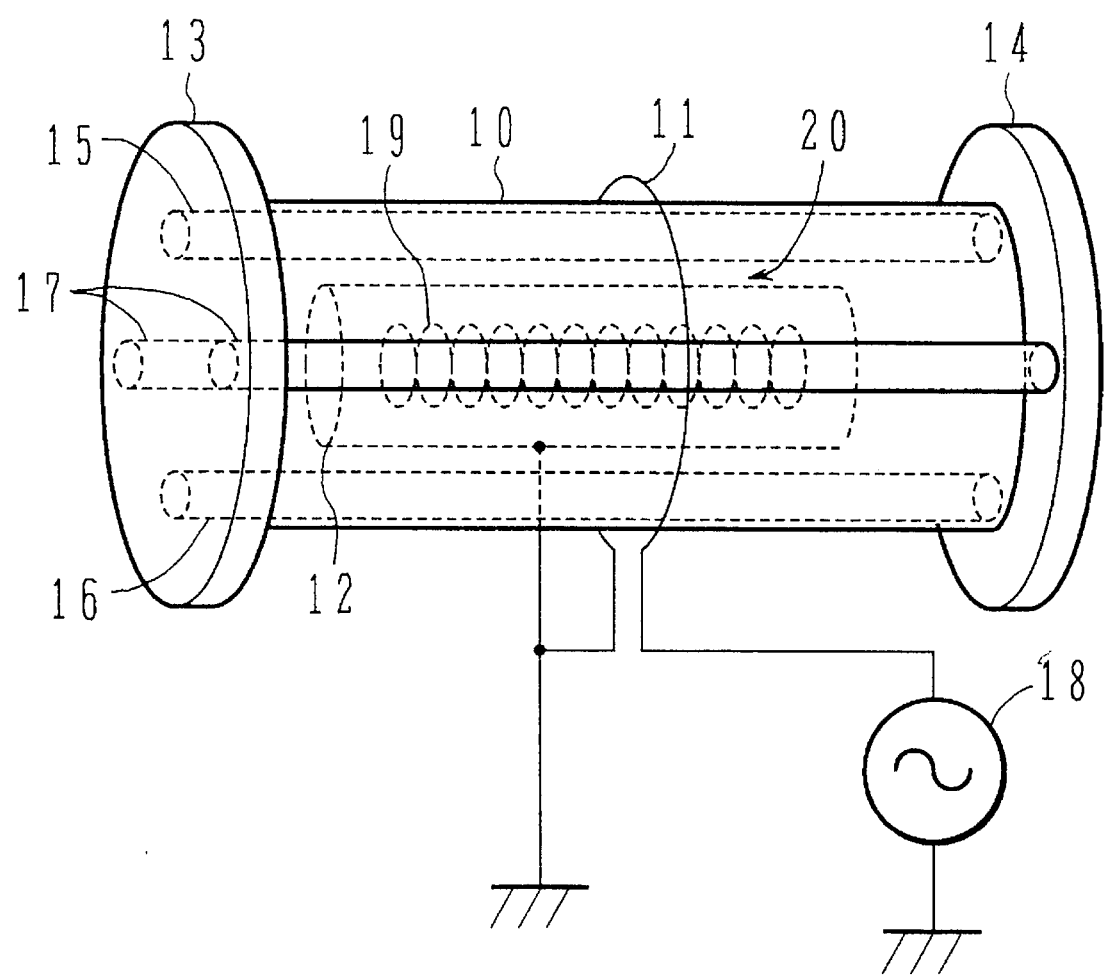
FIG. 1 is a schematic perspective view of a plasma processing system according to an embodiment of the invention.

FIG. 1 is a schematic perspective view of a plasma processing system. A coil 11 is disposed on the outer circumference of a cylindrical process chamber 10. The process chamber 10 is made of, for example, quartz. The coil 11 is supplied with RF current from an RF power source 18.

A cylindrical member 12 having a diameter smaller than the process chamber 10 is coaxially disposed in the process chamber 10. The cylindrical member 12 is made of a non-magnetic and conductive body, and grounded. A cylindrical space 20 is defined between the inner circumference of the process chamber 10 and the outer circumference of the cylindrical member 12. For the plasma process, wafers 19 are disposed in the inner space of the cylindrical member 12.

A gas supply pipe 15 and a gas exhaust pipe 16 are disposed in the cylindrical space 20 at its upper and lower positions in parallel to the axial direction thereof. Heaters 17 are disposed on both sides of the outer circumference of the process chamber 10 in parallel to the axial direction thereof. The heaters 17 allow the inside of the process chamber 10 to be heated.

Both the ends of the process chamber 10 are hermetically sealed by flanges 13 and 14. At least one ends of the gas supply and exhaust tubes 15 and 16 communicate to the outside of the chamber in order to introduce fresh process gas into the gas supply pipe 15 and exhaust used process gas from the gas exhaust pipe 16.

Examples of the structure of the coil 11 shown in FIG. 1 will be described with reference to FIGS. 2A to 2C.

Figure 2A:
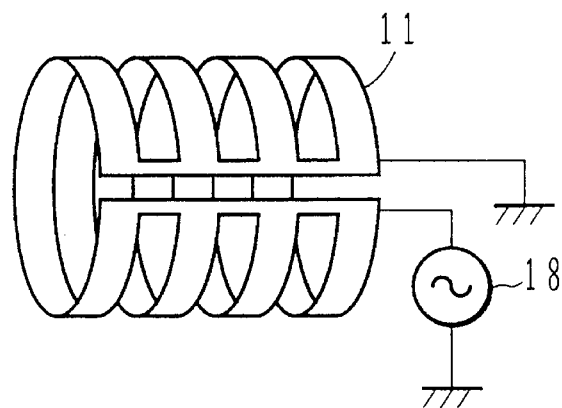
FIGS. 2A to 2C are perspective views of plasma generating coils for use with by the plasma processing system shown in FIG. 1.

FIG. 2A shows a first example of the structure of the coil 11. Coils of one turn having generally the same diameter are coaxially disposed and connected in parallel to form a parallel circuit. One end of the parallel circuit is connected to the RF power source 18, and the other end thereof is grounded. RF current is supplied to the parallel circuit from the RF power source 18. In FIG. 2A, four coils of one turn are connected in parallel. The number of coils is not limited to four, but can be increased or decreased depending upon the length of a space where plasma is to be generated.

Figure 2B:
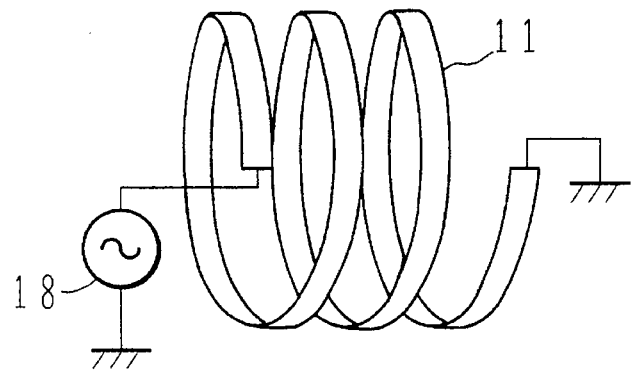

FIG. 2B shows a second example of the structure of the coil 11. A solenoidal coil 11 of three turns is formed, one end thereof being connected to the RF power source 18 and the other end thereof being grounded. It is preferable to increase or decrease the number of coil turns depending upon the length of a space where plasma is to be generated.

The structures shown in FIGS. 2A and 2B may be combined to connect a plurality of coils of two or more turns in parallel.

Figure 2C:
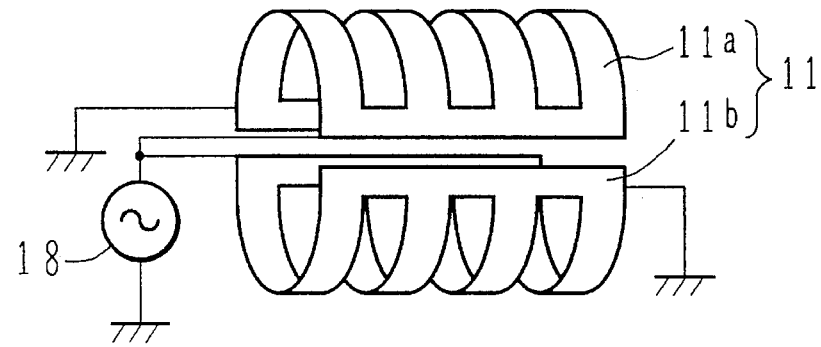

FIG. 2C shows a third example of the structure of the coil 11. Two sets of coils 0.5 turns are coaxially disposed at upper and lower positions relative to the center axis. Two sets of these half-turn coils are each connected in parallel to form parallel coil groups 11a and 11b. One ends of the parallel coil groups 11a and 11b are connected to the RF power source and the other ends thereof are grounded.

The parallel coil groups 11a and 11b are disposed facing each other through the process chamber 10. In this case, one end of one coil group 11a connected to the RF power source 18 is disposed adjacent to one end of the other coil group 11b connected to ground, and vice versa. With this arrangement, quasi loop current is allowed to flow through the two coil groups 11a and 11b.

When RF current is flowed through each of the coils shown in FIGS. 2A to 2C, alternating magnetic field can be generated in the process chamber 10 in the axial direction.

In the above description, "one turn" or "half-turn" coils are used. They need not be exactly one turn or half turn, but may be a little more or a little less. The term "generally" will be used to cover such modifications which have practically the same effects.

Figure 3:
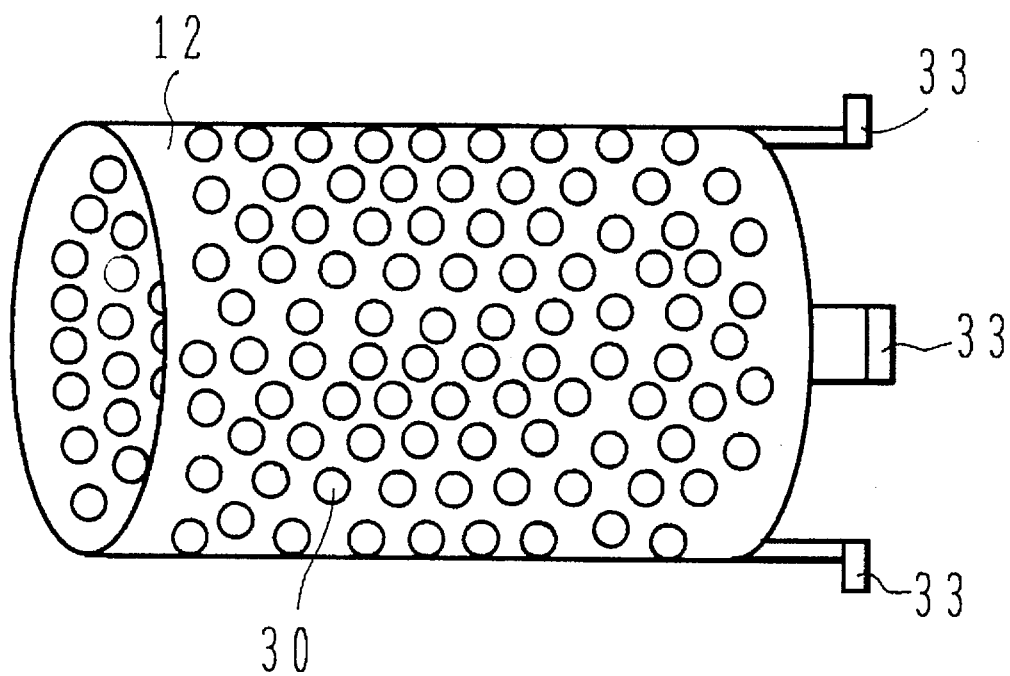
FIG. 3 is a perspective view of a cylindrical member for use with the plasma processing system shown in FIG. 1.

FIG. 3 is a perspective view of the cylindrical member 12 shown in FIG. 1. A number of through holes 30 are formed in the wall of the cylindrical member 12. Process gas can be transported between the outer and inner spaces of the cylindrical member 12 through these through holes 30. Fixing metal pieces 33 are mounted on one end of the cylindrical member 2 for fixing the member 12 along the center axis of the process chamber 10. During the plasma process, the fixing metal pieces 33 are connected to the flange 14 shown in FIG. 1 to fix the cylindrical member 12 and connected to the ground. The cylindrical member 12 is made of non-magnetic and conductive material.

Figure 4A:
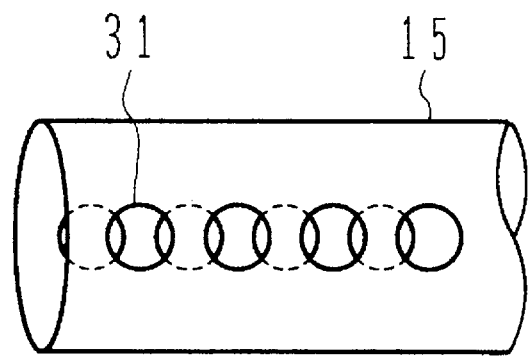
FIGS. 4A and 4B are perspective views of a gas supply pipe and a gas exhaust pipe for use with the plasma processing apparatus shown in FIG. 1.

FIG. 4A is a partially enlarged perspective view of the gas supply pipe 15. A plurality of through holes 31 are formed in the wall of the pipe 15 and aligned in the axial direction. The through holes are formed in two rows facing each other across the center axis. Process gas introduced into the gas supply pipe 15 is uniformly supplied to the process chamber through the through holes 31.

Figure 4B:
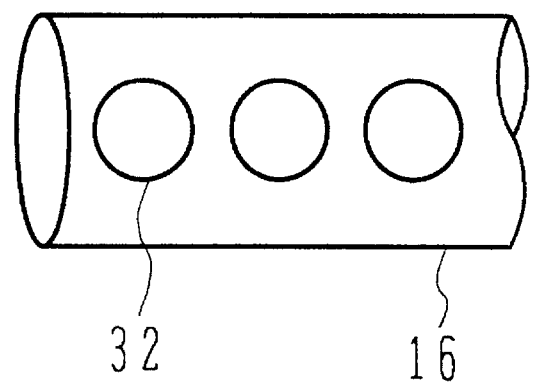

FIG. 4B is a partially enlarged perspective view of the gas exhaust pipe 16. A plurality of through holes 32 are formed in the wall of the pipe 16 and aligned in the axial direction. The holes 32 has a larger diameter than that of the hole 31 of the gas supply pipe 15. Process gas in the process chamber 10 is exhausted through the through holes by evacuating the inside of the gas exhaust pipe 16.

During the plasma process using the plasma processing system constructed as above, wafers 19 are held by a carrier and placed in the inner space of the cylindrical member 12, as shown in FIG. 1.

Process gas is introduced into the gas supply pipe 15 and RF current is flowed through the coil 11. Plasma is generated in the cylindrical space 20, but is not generated in the inner space of the cylindrical member 12. The principle of this operation will be later studied. Radicals in the plasma generated in the cylindrical space 20 are transported to the inner space of the cylindrical member 12 through the through holes 30 formed in the wall of the member 12.

These radicals reach the surfaces of wafers and react with them. Charged particles in the plasma are shielded by the grounded cylindrical member 12. Since wafers are not directly exposed to plasma, they can be protected from the damage by the plasma.

Next, the experiment results of ashing using the plasma processing system shown in FIG. 1 will be given. As the process chamber 10, a quartz tube having a diameter of 310 mm and a length of 400 mm was used, and as the plasma generating coil 11, a coil as shown in FIG. 2A was used which has six coils of one turn connected in parallel and the width of each coil was 30 mm.

The cylindrical member 12 was made of aluminum coated with $SiO_2$-based ceramics. The cylindrical member 12 had an inner diameter of 220 mm, a wall thickness of 2 mm, a length of 300 mm, and a through hole diameter of 5 min. The through holes were formed in the wall of the cylindrical member 12 over the whole area of the wall at a pitch of 10 mm.

As process gas, $O_2$ gas was flowed at a flow rate of 1000 sccm, the pressure of the inner space of the process chamber 10 was set to 0.8 Torr, an RF power of 1 kW was used, an initial temperature in the process chamber 10 was set to 70° C., and twenty five wafers were ashed at the same time. An ashing rate of about 90 nm/min was obtained.

Figure 10A:
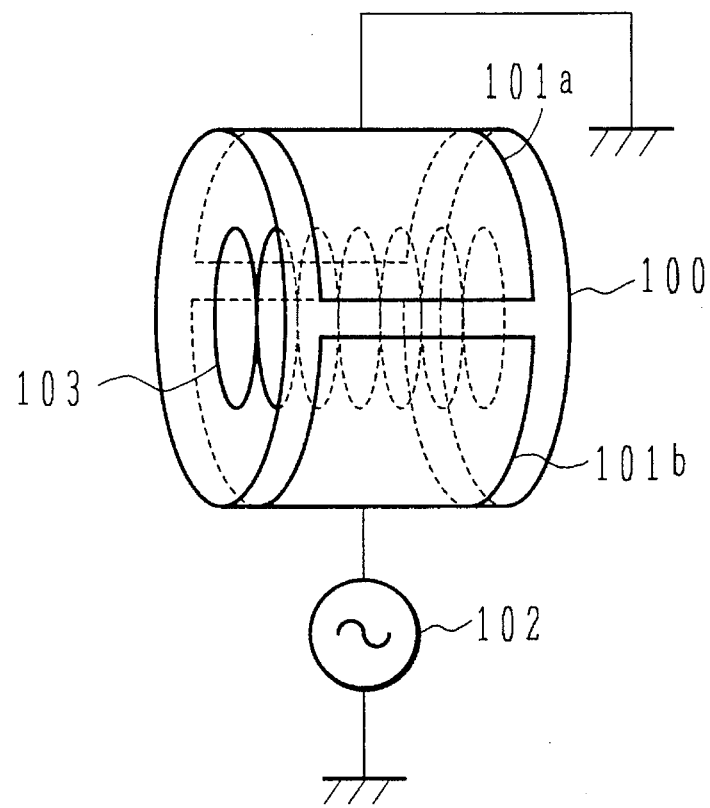
FIG. 10A is a schematic perspective view of a conventional barrel type plasma processing system.
Figure 10B:
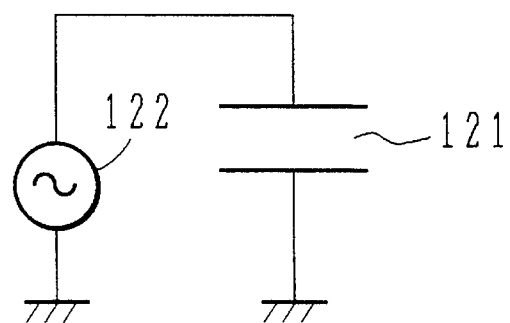
FIG. 10B is a diagram of an equivalent circuit of the plasma processing system shown in FIG. 10A.
Figure 11A:
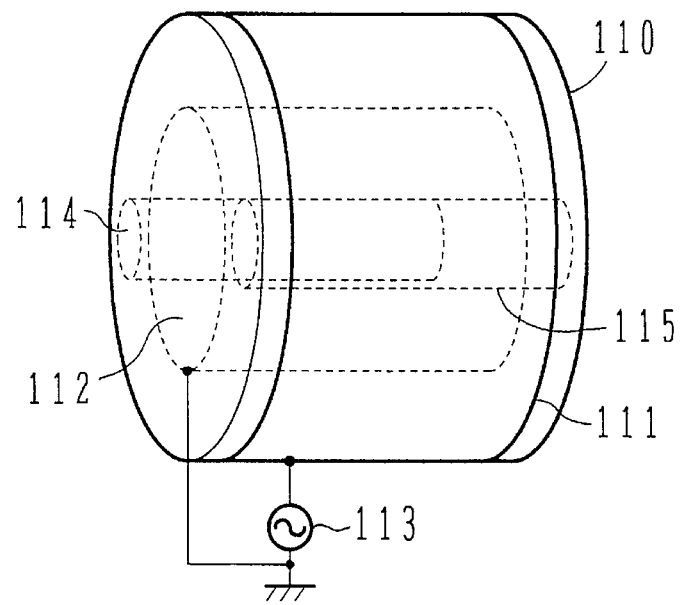
FIGS. 11A and 11B are schematic perspective and cross sectional views of a conventional coaxial type plasma processing system.
Figure 11B:
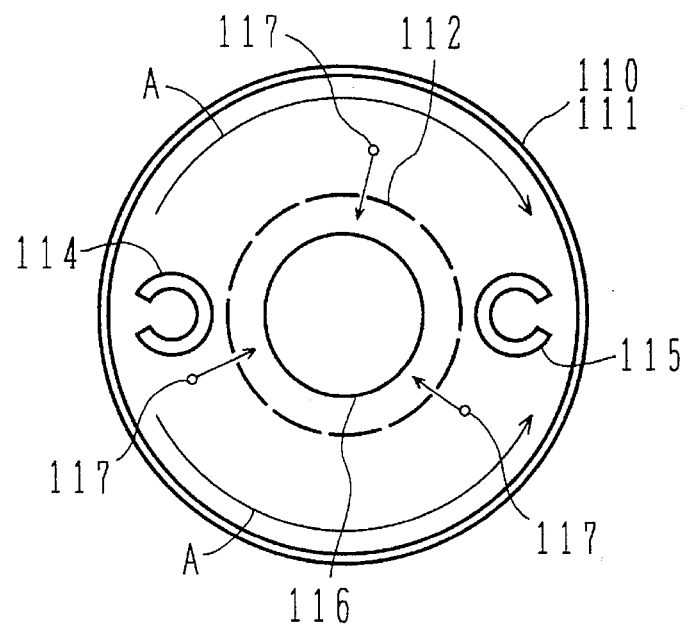

Ashing rates of the barrel type plasma processing system shown in FIG. 10A and the coaxial plasma processing system shown in FIGS. 11A and 11B were 90 nm/min and 50 nm/min, respectively, under the same conditions as above.

By using the plasma processing system of the embodiment shown in FIG. 1, it was possible to obtain a process speed generally the same as the conventional barrel type plasma processing system. Since the surface of a wafer is not directly exposed to plasma, it can be considered that there is no damage by the plasma.

Plasma density of inductively coupled plasma is generally greater by about two digits than that of capacitively coupled plasma, and inductively coupled plasma generates more radicals. It can be therefore considered that the plasma processing system shown in FIG. 1 could provide an ashing rate comparable to a conventional barrel type plasma processing system.

In the above experiments, the plasma process is used for ashing. Other plasma processes may also be performed by changing process gas. For example, if $NF_3$ is used as process gas, phosphorus silicate glass (PSG) can be etched. Other processes such as plasma CVD are also applicable.

Figure 5A:
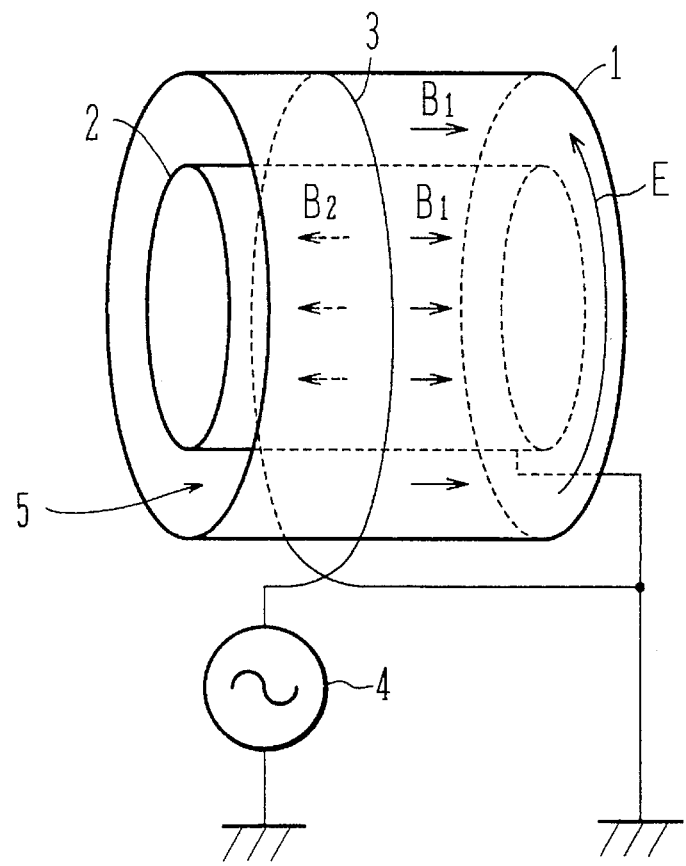
FIG. 5A is a schematic perspective view of a plasma generating system of the plasma processing system shown in FIG. 1, illustrating the principle of plasma generation.
Figure 5B:
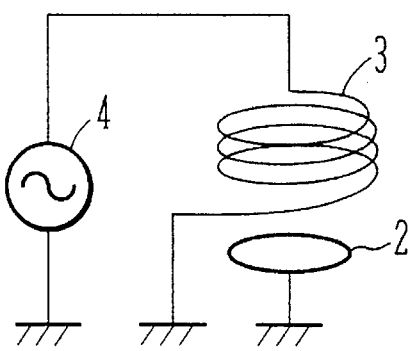
FIG. 5B is a diagram of an equivalent circuit of the plasma generating system shown in FIG. 5A.

The principle of generating plasma in the above embodiment will be studied with reference to FIGS. 5A and 5B.

FIG. 5A is a schematic diagram of a plasma generating system. A cylindrical member 2 made of an electrically conductive material is generally coaxially disposed in a cylindrical process chamber 1. The cylindrical member 2 is grounded. A coil 3 is wound around the outer circumference of the process chamber 1. RF current is supplied to the coil 3 from an RF power source 4.

When RF current is supplied to the coil 3, an alternating magnetic field B1 is generated in the process chamber 1 in the axial direction. As the alternating magnetic field B1 changes with time, the number of magnetic fluxes linked with the cylindrical member 2 changes. This change in the number of linking magnetic fluxes generates an electromotive force in the cylindrical member 2 in its circumferential direction.

Since the cylindrical member 2 is made of an electrically conductive body, this electromotive force causes current to flow in the circumferential direction. This current generates another alternating magnetic field B2 which cancels a change in the alternating magnetic; field generated in the process chamber 1. It is therefore considered that the combined magnetic field in the inner space of the cylindrical member 2 rarely changes. Only the magnetic field in the cylindrical space 5 between the process chamber 1 and cylindrical member 2 is periodically changed by the RF current flowing in the coil 3.

As the magnetic field B1 in the cylindrical space 5 in the axial direction changes, an RF electric field E is generated in the circumferential direction, linking with the magnetic field B1. As gas is introduced into the cylindrical space 5, inductively coupled plasma is generated by this RF electric field E. Neither the RF magnetic field nor the RF electric field are generated in the inner space of the cylindrical member 2, and plasma is not generated therein.

In order to efficiently generate an alternating magnetic field in the cylindrical space 5, it is preferable that the cylindrical member is non-magnetic.

FIG. 5B is a diagram of an equivalent circuit of the plasma generating system shown in FIG. 5A. RF current is supplied to the coil 3 from the RF power source 4. As described previously, as current flows through the coil 3, current flows in the cylindrical member 2 in the circumferential direction. Therefore, the cylindrical member 2 can be considered as an inductor inductively coupled with the coil 3, i.e., as shown in FIG. 5B, the cylindrical member 2 can be considered as a loop coil 2.

A plasma processing system according to another embodiment of the invention will be described with reference to FIGS. 6A to 6C.

Figure 6A:
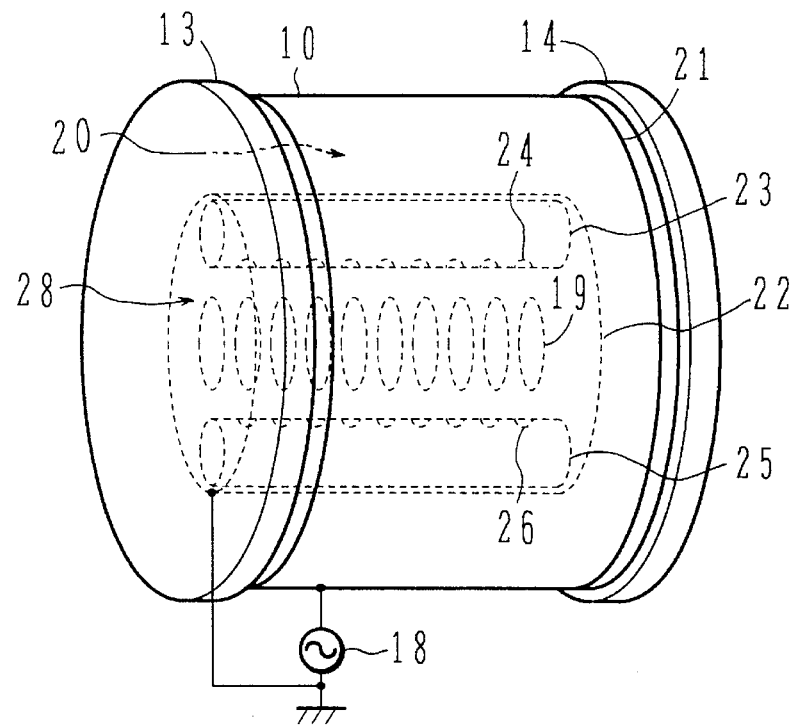
FIGS. 6A to 6C are a schematic perspective view showing a plasma processing system according to another embodiment of the invention, a perspective view showing the details of an internal electrode, and a perspective view showing a wafer basket.

FIG. 6A is a schematic perspective view of a plasma processing system. The plasma processing system includes process chamber 10, flanges 13 and 14, an external electrode 21, an internal electrode 22, a gas supply pipe 28, a gas exhaust pipe 25, and a RF power source 18.

A cylindrical process chamber 10 and flanges 13 and 14 hermetically sealing both ends of the process chamber 10 define an internal space. The process chamber 10 and flanges 13 and 14 are made of, for example, quartz. The external electrode 21 is disposed surrounding the outer circumference of the process chamber 10 and connected to the RF power source 18.

The internal electrode 22 is cylindrical and coaxially disposed in the process chamber 10 and grounded. The internal electrode 22 partitions the inner space of the process chamber and defines an inner process space 28 and an outer plasma generating space 20.

The gas supply pipe 23 and gas exhaust pipe 25 are disposed in the process chamber 28 at upper and lower positions in parallel to the center axis of the internal electrode 22. A plurality of gas supply holes 24 and gas exhaust holes 26 are formed in the walls of the gas supply pipe 23 and gas exhaust pipe 25, the holes directing toward the center axis of the internal electrode 22 in the axial direction.

The ends of the gas supply pipe 23 and gas exhaust pipe 25 on the side of the flange 14 are sealed, and the other ends on the side of the flange 13 extend to the outside of the process chamber 10. The end of the gas supply pipe 23 extended to the outside is connected to a process gas source (not shown). The end of the gas exhaust pipe 25 extended to the outside is connected to a vacuum pump (not shown).

For the plasma process, wafers 19 are placed on and held by a wafer basket to be later described and placed in the process space 28.

Figure 6B:
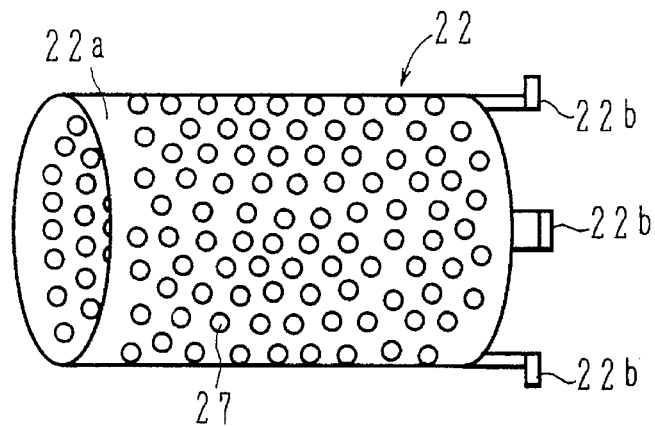

FIG. 6B is a perspective view of the internal electrode shown in FIG. 6A. The internal electrode 22 is constituted by a cylindrical member 22a and fixing metal pieces 22b. A number of through holes 27 are formed in the wall of the cylindrical member 22a. Gas is transported through these through holes between the inner and outer spaces of the cylindrical member 22a. The fixing metal pieces 22b are mounted on the flange 14 shown in FIG. 6A to fix the cylindrical member 22a in the process chamber 10.

Figure 6C:
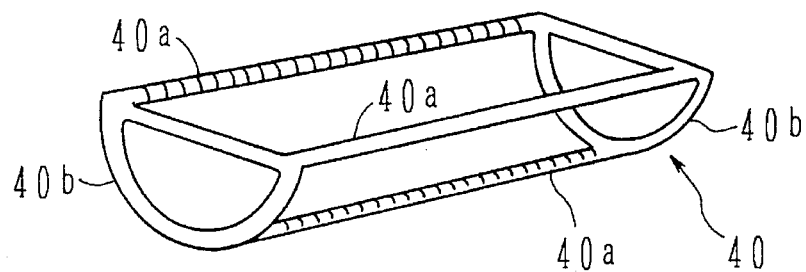

FIG. 6C shows the wafer basket 40 for holding wafers 19 shown in FIG. 6A. Opposite ends of three quartz rods 40a of a circular cross section are fixed by semi-circular fixing members 40b made of quartz. A plurality of grooves or notches are formed in the quartz rods 40a in the circumferential direction. Wafers are inserted into these grooves and supported by three points of the three quartz rods 40a.

The operation of the plasma processing system shown in FIGS. 6A to 6C will be described with reference to FIG. 7.

Figure 7:
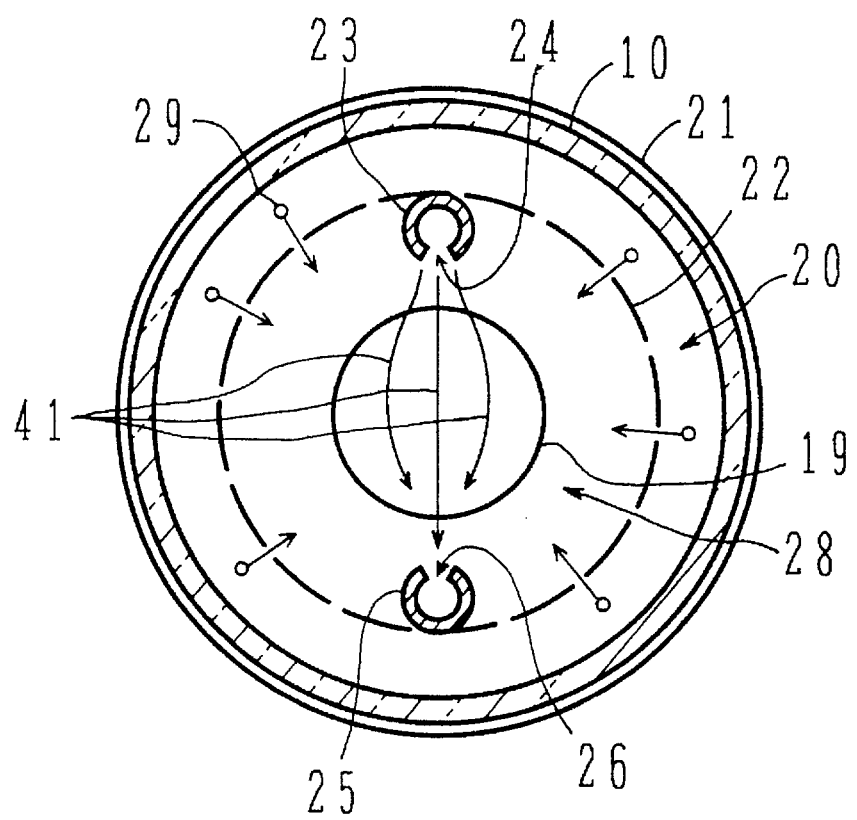
FIG. 7 is a cross sectional view of the plasma processing system shown in FIGS. 6A to 6C as cut in a plane vertical to the center axis thereof.

FIG. 7 is a cross sectional view of the plasma processing system shown in FIG. 6A as cut in a plane perpendicular to the center axis. The process chamber 10, external electrode 21, and internal, electrode 22 are coaxially disposed. The gas supply pipe 23 and gas exhaust pipe 25 are disposed in the inner process space 28 of the inner electrode 22 at upper and lower positions. Wafers 19 are inserted into the space between the gas supply pipe 23 and gas exhaust pipe 25.

As process gas is introduced into the gas supply pipe 23, it is guided into the process space 28 through the gas jet holes 24. The process gas is diffused into the process space 28 and plasma generating space 20. When an RF voltage is applied between the internal electrode 22 and external electrode 21, capacitively coupled plasma is generated in the plasma generating space 20.

Since the process gas is introduced into the gas exhaust pipe 25 through the gas intake holes 26, a gas flow 41 is generated in the direction from the gas supply pipe 23 to the gas exhaust pipe 25. In this manner, the process gas flows through spaces between a plurality of adjacent wafers 19. Radicals 29 in the plasma are diffused through the through holes of the internal electrode 22 into the process space 28. Radicals diffused into the process space 28 are transported by the gas flow 41 near to the surfaces of wafers 19.

Since radicals are forcibly transported by the gas flow 41 near to the surfaces of wafers 19, radicals can be more efficiently transported than the transportation only by diffusion. Furthermore, reaction by-products are also forcibly exhausted by the gas flow, and new radicals are always supplied.

Next, another embodiment will be described with reference to FIG. 8.

Figure 8:
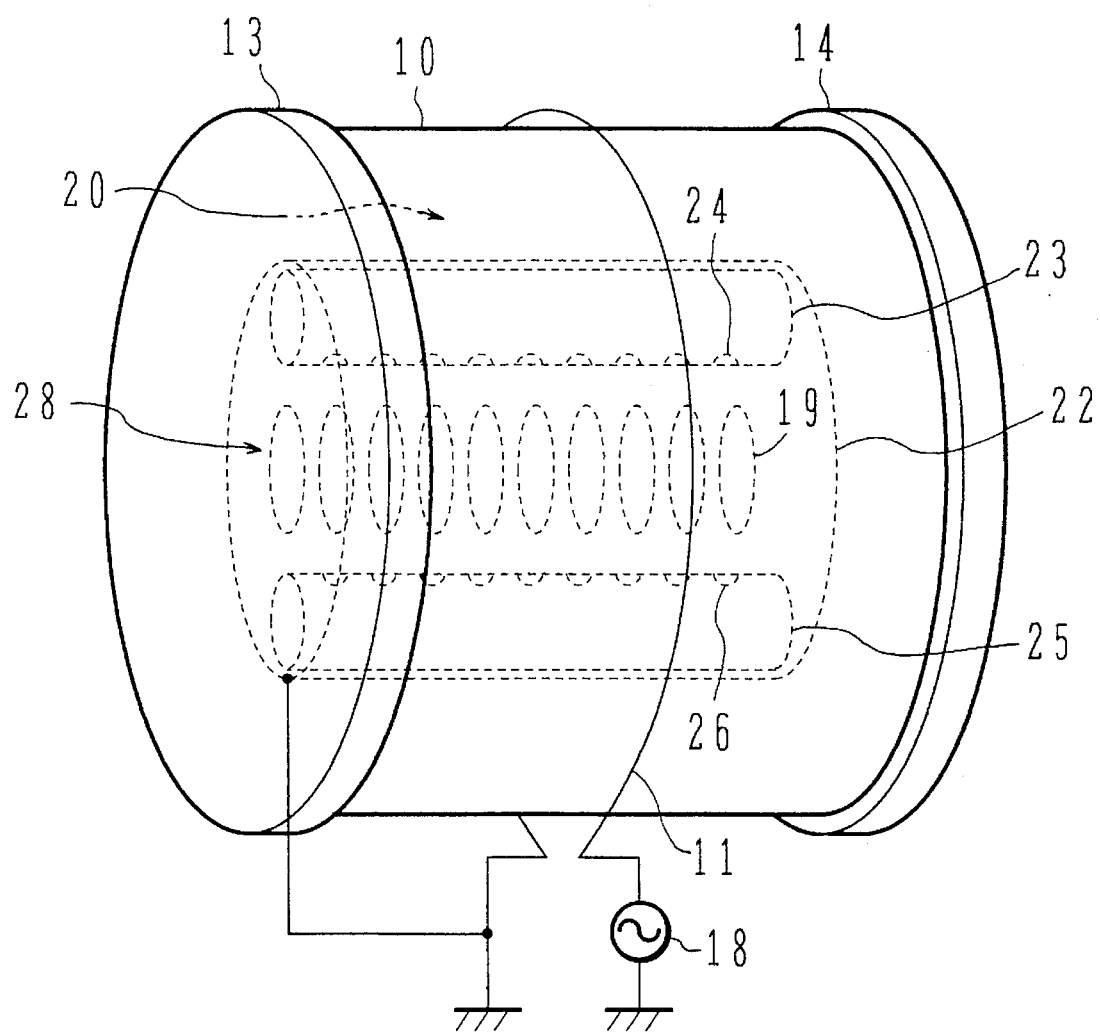
FIG. 8 is a schematic perspective view of a plasma processing system according to another embodiment of the invention.

FIG. 8 is a schematic perspective view of a plasma processing system according to another embodiment. Instead of the external electrode 21 of the plasma processing system shown in FIG. 6A, an RF coil 11 is wound on the outer circumference of a process chamber 10. The other elements have the same structures as the plasma processing system shown in FIG. 6A. The RF coil 11 is connected to an RF power source 18 which supplies the coil 11 with RF current.

The RF coil 11 is similar to the RF coil of the embodiment shown in FIG. 1, and has the structure such as shown in FIGS. 2A to 2C.

The operation of the plasma processing system shown in FIG. 8 will be described.

When RF current is supplied to the coil 11, an RF alternating magnetic field is generated in the process chamber 10 in the axial direction. As the alternating magnetic field changes its intensity with time, the number of magnetic fluxes linked with the internal electrode 22 changes. This change in the number of linking magnetic fluxes generates an electromotive force in the internal electrode 22 in its circumferential direction.

This electromotive force causes current to flow in the internal electrode 22 in the circumferential direction. This current generates another alternating magnetic field in the process space 28 which cancels a change in the alternating magnetic field generated by the current flowing in the coil 11. It is therefore considered that the combined magnetic field in the process space 28 rarely changes. Only the magnetic field in the plasma generating space 20 is periodically changed by the RF current flowing in the coil 11.

As the magnetic field in the plasma generating space 20 in the axial direction changes, an RF electric field is generated in the circumferential direction, linking with the magnetic field. This RF electric field generates inductively coupled plasma. Neither the alternating magnetic field nor the RF electric field are generated in the process space 28, and plasma is not generated therein. In order to efficiently generate an alternating magnetic field in the plasma generating space 20, it is preferable that the inner electrode 22 is non-magnetic. For example, the inner electrode is made of aluminum coated with a ceramic material.

A flow of process gas is the same as the gas flow described with FIG. 7. Therefore, the same effects can be expected also for inductively coupled plasma. A density of inductively coupled plasma is greater than that of capacitively coupled plasma. Therefore, radicals of a high density are supplied to the surfaces of wafers and a plasma process speed can be improved.

Next, experiments of ashing a novolak resist film by using the plasma processing system shown in FIG. 8 will be described.

The detailed structures of the plasma processing system used by the experiments are as follows. The process chamber 10, flanges 13 and 14, gas supply pipe 23, and gas exhaust pipe 25 are made of quartz. The thickness of the plasma generating space in the radial direction is 5 to 6 cm. The diameter of the gas supply pipe 23 is 15 mm, and the diameter of the gas jet hole 24 is 5 to 6 mm. The diameter of the gas exhaust pipe 25 is 30 mm, and the diameter of the gas intake hole 26 is 20 mm. The pitch of gas jet holes 24 and gas intake holes 26 are made gradually narrower from the open ends connected to the gas supply source and vacuum pump toward the closed ends.

The RF coil 11 is a plated Al coil or plated Cu coil. The inner electrode 22 is made of a cylindrical Al member coated with a ceramic material. Through holes having a diameter of 5 mm are formed in the internal electrode 22 at a pitch of about 10 mm over the whole wall area of the electrode. Wafers to be processed are 6-inch wafers. A distance between the upper edge of a wafer 19 inserted into the process space 28 and the inner upper wall of the inner electrode is about 10 cm.

$O_2$ gas was supplied to the plasma processing system from the gas supply pipe 23 at a flow rate of 3000 sccm, and it was exhausted so as to maintain the inner pressure of the process chamber 10 at 0.8 Torr. Plasma was generated by supplying an RF power of 1 kW from the RF power source 18 to the RF coil 11 at a frequency of 13.56 MHz.

Under the above conditions, twenty five wafers 19 coated with a resist layer disposed at a pitch of 9.52 mm were ashed at the same time. An ashing rate of 90 nm/min for the resist was obtained. Generally the same ashing rate was obtained when fifty wafers 19 disposed at a pitch of 4.76 mm were ashed at the same time under the same conditions. In contrast, with the conventional plasma processing system shown in FIG. 11A, an ashing rate was about 30 nm/min for wafers at a pitch of 4.76 min.

It can be understood from the above experiments that a high ashing rate can be obtained by using the plasma processing system of this embodiment even if a pitch between wafers is made narrow. In the above experiments, although a resist film is ashed, a relatively high etching rate is expected also for etching a wafer surface. For example, by introducing $NF_3$ gas into the gas supply pipe 23, a film such as a phospho-silicate glass (PSG) film and a boro-silicate glass (BSG) is expected to be etched at a high etching rate.

With the plasma processing system of this embodiment, the number of wafers capable of being plasma processed at the same time increases and productivity can be improved.

In the above embodiments, although one gas supply pipe and one gas exhaust pipe are used, the number of pipes is not limited to one. If a gas flow passing through a space between adjacent wafers can be formed, the gas supply pipe and gas exhaust pipe may be disposed outside of the process space.

Next, other arrangements of gas supply and exhaust pipes will be described with reference to FIGS. 9A to 9C.

Figure 9A:
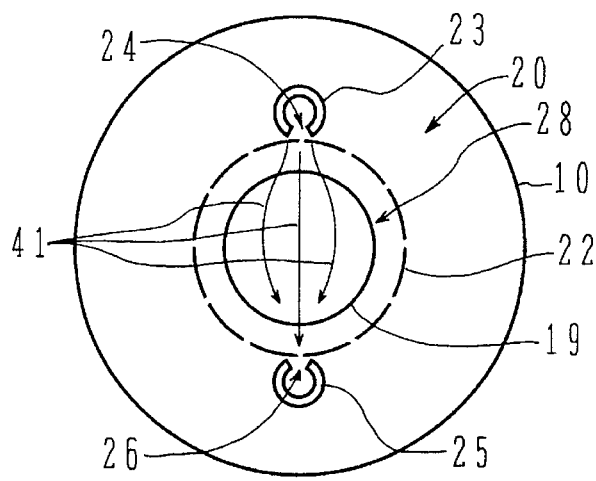
FIGS. 9A to 9C are cross sectional views of the plasma processing system shown in FIGS. 6A to 6C showing other arrangements of gas supply and exhaust pipes.

FIG. 9A shows an example wherein a gas supply pipe 23 and a gas exhaust pipe 25 are disposed outside of a process space 28. The gas supply pipe 23 and exhaust pipe 25 are disposed both in a plasma generating space 20, and face each other with the process space 28 being interposed therebetween. Gas jet holes 24 and gas intake holes 26 are formed in the walls, directing toward the central area of the process space. It is preferable to form through holes of an internal electrode 22 at positions corresponding to the gas jet holes 24 in order not to obstruct a gas flow jetted out from the gas jet holes 24.

Figure 9B:
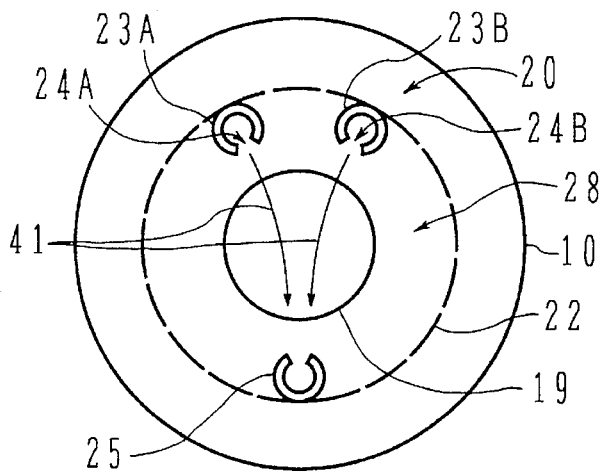

FIG. 9B shows an example wherein two gas supply pipes are used. Gas jet holes 24A and 24B of the two gas supply pipes 23A and 23B are formed in the walls of the gas supply pipes 23A and 23B, directing toward the central area of the process space.

Figure 9C:
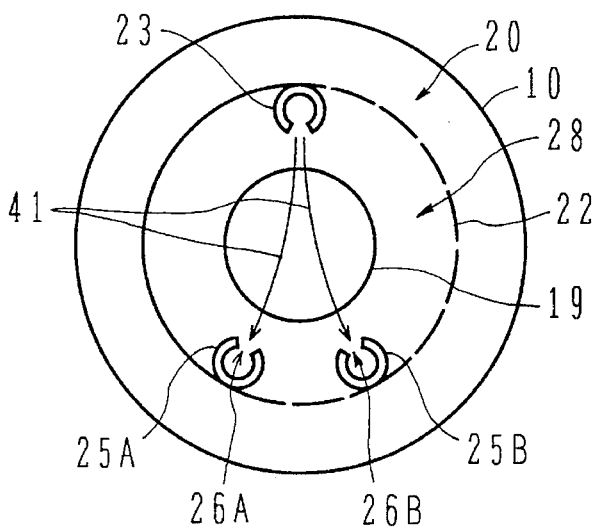

FIG. 9C shows an example wherein two gas exhaust pipes are used. Gas intake holes 26A and 26B of the two gas exhaust pipes 25A and 25B are formed in the walls of the gas exhaust pipes 25A and 25B, directing toward the central area of the process space.

As shown in FIGS. 9A to 9C, gas supply and exhaust pipes are disposed facing each other, with a space, where wafers are disposed, being interposed therebetween. Gas jet and intake holes are formed in the walls of the gas supply and exhaust pipes, directing toward the central area of the process space. In this way, the gas flow passing through the spaces between adjacent wafers can be formed.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. An apparatus for manufacturing a semiconductor device comprising:

a process chamber capable of being evacuated;

field generator for generating an alternating magnetic field in said process chamber;

partition disposed in said process chamber for defining an inner space and generating another alternating magnetic field, said another alternating magnetic field cancelling a change in the alternating magnetic field generated in the inner space, and said partition allowing gas to be transported between the inner space and a space outside of the inner space;

a first gas passage for supplying process gas to said process chamber; and second gas passage for exhausting gas from said process chamber.

2. An apparatus according to claim 1, wherein said field generator for generating an alternating magnetic field comprises:

a coil wound on an outer surface of said process chamber; and a radio frequency power source for supplying radio frequency current to said coil.

3. An apparatus according to claim 2, wherein said coil comprises a plurality of coils of generally one turn disposed coaxially and connected in parallel.

4. An apparatus according to claim 2, wherein said coil is a solenoid coil.

5. An apparatus according to claim 2, wherein said coil comprises first and second coil groups, the first coil group comprising a plurality of coils of generally a half-turn disposed coaxially on one side of a center axis of said coil and connected in parallel, the second coil group comprising a plurality of coils of generally a half-turn disposed coaxially on another side of the center axis of said coil and connected in parallel, and the first and second coil groups being disposed facing each other with said process chamber being interposed therebetween.

6. An apparatus according to claim 1, wherein said partition is of a cylindrical shape and is made of an electrically conductive body, a plurality of through holes being formed in a wall of the conductive body.

7. An apparatus according to claim 6, wherein said electrically conductive body is grounded.

8. An apparatus according to claim 1, wherein said first gas passage and said second gas passage have a plurality of openings directed to the inner space.

9. An apparatus according to claim 8, wherein one of said first and second gas passages is disposed in the inner space.

10. An apparatus according to claim 8, wherein said first and second gas passages are both disposed in the inner space.

11. An apparatus according to claim 8, wherein one of said first and second gas passages is disposed outside of the inner space.

12. An apparatus according to claim 8, wherein said first and second gas passages are both disposed outside of the inner space.

13. An apparatus for manufacturing a semiconductor device comprising:

a process chamber having an inner space;

partition for partitioning the inner space into a plasma generating space and a process space where a workpiece is to be disposed for plasma process, said partition being formed with gas flow holes allowing gas to be transported between the plasma generating space and the process space;

first gas passage disposed in the inner space for supplying process gas to said process space; and a second gas passage for exhausting the process gas from the inner space.

14. An apparatus according to claim 13, wherein said first gas passage is disposed in the process space near at a peripheral area thereof.

15. An apparatus according to claim 13, wherein said second gas passage is disposed facing said first gas passage with a central area of the process space being interposed therebetween.

16. An apparatus according to claim 13, wherein said partition is of a cylindrical shape and defines the process space inside of said partition and the plasma generating space outside of said partition, and said first gas passage is a straight tube disposed generally in parallel to said partition in an axial direction, and a plurality of gas jet holes are formed through a wall of the straight tube facing a central area of the process space and aligned along the axial direction.

17. An apparatus according to claim 13, wherein said second gas passage is a straight tube disposed generally in parallel to said partition in an axial direction, and a plurality of gas intake holes are formed through a wall of the straight tube facing a central area of the process space and aligned along the axial direction.

18. An apparatus according to claim 13, wherein said partition is made of electrically conductive material, said apparatus further comprising:

an external electrode mounted on an outer surface of said process chamber surrounding the plasma generating space; and a radio frequency power source for supplying a radio frequency voltage across said partition and said outer electrode.

19. An apparatus according to claim 13, wherein said partition is made of electrically conductive material, said apparatus further comprising:

a radio frequency coil wound on an outer surface of said process chamber surrounding the inner space of said process chamber; and a radio frequency power source for supplying radio frequency current to said radio frequency coil.

20. An apparatus according to claim 19, wherein said coil comprises a plurality of coils of generally one turn disposed coaxially and connected in parallel.

21. An apparatus according to claim 19, wherein said coil is a solenoid coil.

22. An apparatus according to claim 19, wherein said coil comprises first and second coil groups, the first coil group comprising a plurality of coils of generally a half-turn disposed coaxially on one side of a center axis of said coil and connected in parallel, the second coil group comprising a plurality of coils of generally a half-turn disposed coaxially on another side of the center axis of said coil and connected in parallel, and the first and second coil groups being disposed facing each other with said process chamber being disposed therebetween.

23. An apparatus according to claim 18, wherein said partition is grounded.

24. An apparatus according to claim 19, wherein said partition is grounded.

* * * * *